United States Patent

Cadotte, Jr. et al.

[11] Patent Number: 5,585,330
[45] Date of Patent: Dec. 17, 1996

[54] LOW-LOSS, WIDE BANDWIDTH LIMITER

[75] Inventors: Roland Cadotte, Jr., Freehold; Richard W. Babbitt, Fair Haven, both of N.J.; Xiaoguang G. Sun, King of Prussia, Pa.

[73] Assignee: The United States of America as represented by the Secretary of the Army, Washington, D.C.

[21] Appl. No.: 370,591

[22] Filed: Jan. 9, 1995

[51] Int. Cl.$^6$ .............................. H01P 1/22; H01B 12/06
[52] U.S. Cl. .......................... 505/210; 505/700; 505/701; 505/866; 333/17.2; 333/99.005
[58] Field of Search ................... 333/17.2, 81 A, 333/995, 246; 505/210, 700, 701, 866

[56] References Cited

U.S. PATENT DOCUMENTS 3,593,207  7/1971  Woermbke et al. .............. 333/17.2 X
5,061,909  10/1991  Hjipieris et al. ..................... 333/17.2
5,235,309  10/1993  Preisler et al. ........................ 505/210
5,329,261  7/1994  Das ........................................ 333/17.2

*Primary Examiner*—Benny T. Lee
*Attorney, Agent, or Firm*—Michael Zelenka; William H. Anderson

[57] ABSTRACT

A high-temperature superconductor ($HT_cS$) in a microstrip configuration which is electrically related to a superconducting coupler and which is controlled by a heater disposed over the superconducting microstrip line. This limiter configuration is used in a series configuration with other circuitry and utilizes the low loss characteristics of the $HT_cS$ material and the wide bandwidth characteristics of microstrip. The structure itself is a five layer microstrip geometry which includes a normal metal ground plane; a dielectric substrate disposed on the metal ground plane; a superconducting microstrip transmission disposed on the substrate; a dielectric film layer disposed on the superconducting microstrip; and a heating element disposed on the dielectric film layer and over the superconducting microstrip.

17 Claims, 3 Drawing Sheets

LOW-LOSS, WIDE BANDWIDTH LIMITER

GOVERNMENT INTEREST

The invention described herein may be manufactured, used, and licensed by or for the Government of the United States of America without the payment to us of any royalty thereon.

FIELD OF THE INVENTION

This invention relates to the field of power limiters and more particularly to microwave power limiters using superconducting material.

BACKGROUND OF THE INVENTION

Power limiters are commonly used in a variety of military and commercial microwave systems. The basic function of a power limiter is to protect sensitive electronics from RF powers above a predetermined critical value because some devices can be permanently damaged when subjected to an electrical field of a sufficient magnitude. An ideal RF limiter should have the following characteristics:

$$P_{out} = P_{in}, \text{ if } P_{in} \leq P_{max}$$

$$P_{out} = P_{max}, \text{ if } P_{in} > P_{max}$$

wherein $P_{in}$ and $P_{out}$ are, respectively, the input signal power to the limiter and the output signal power from the limiter, and $P_{max}$ is the specific limiting power level of the power limiter. This implies that an ideal limiter would have zero "off" resistance when $P_{in} \leq P_{max}$, and would provide a proportional resistance as the device turns "on" such that the output signal is limited to $P_{max}$ when $P_{in} > P_{max}$.

Standard power limiters are typically composed of single or multiple diodes (usually PIN diodes) either in a series or a shunt configuration to reflect and attenuate strong incident RF signals. When used in the series configuration, the diodes are biased off to reflect and attenuate the RF signal and when used in the shunt configuration the diodes are biased on to reflect the RF signal. In either of these configurations, the finite conductance characteristics of the PIN diode causes an undesired reflection and attenuation of the RF signal, that is, when the power limiter need not limit power. Therefore, these standard diode limiters always cause some insertion loss. Further, the inherent reactance of the conventional limiters limits the bandwidth or frequency range of operation. Examples of commercially available diode limiters can be found in various product catalogs, such as Triangle Microwave, 1986.

Accordingly, there is a need in the electronics industry to provide a power limiter with an increased bandwidth and a lower insertion loss. The present invention addresses such a need.

SUMMARY OF THE INVENTION

Accordingly, one object of the present invention is to provide for a power limiter which has an extremely low loss in the non-attenuating state.

Another object of the present invention is to provide for such a limiter which can operate at a wide frequency bandwidth.

These and other objects of the present invention are achieved by providing a high-temperature superconductor ($HT_cS$) in a microstrip configuration which is electrically related to a superconducting coupler and which is controlled by a heater disposed over the superconducting microstrip line. This limiter configuration is used in a series configuration with other circuitry and utilizes the low loss characteristics of the $HT_cS$ material and the wide bandwidth characteristics of microstrip. The structure itself is a five layer microstrip geometry which includes a normal metal ground plane; a dielectric substrate disposed on the metal ground plane; a superconducting microstrip transmission line disposed on the substrate; a dielectric film layer disposed on the superconducting microstrip; and a heating element disposed on the dielectric film layer and over the superconducting microstrip.

BRIEF DESCRIPTION OF THE DRAWINGS

These and other features of the present invention will be better understood in light of the ensuing Detailed Description of the invention and the related figures wherein.

It should be noted that for purposes of illustration some of the elements shown in the figures have not been drawn to scale.

DETAILED DESCRIPTION OF THE EMBODIMENT

Figure 1:
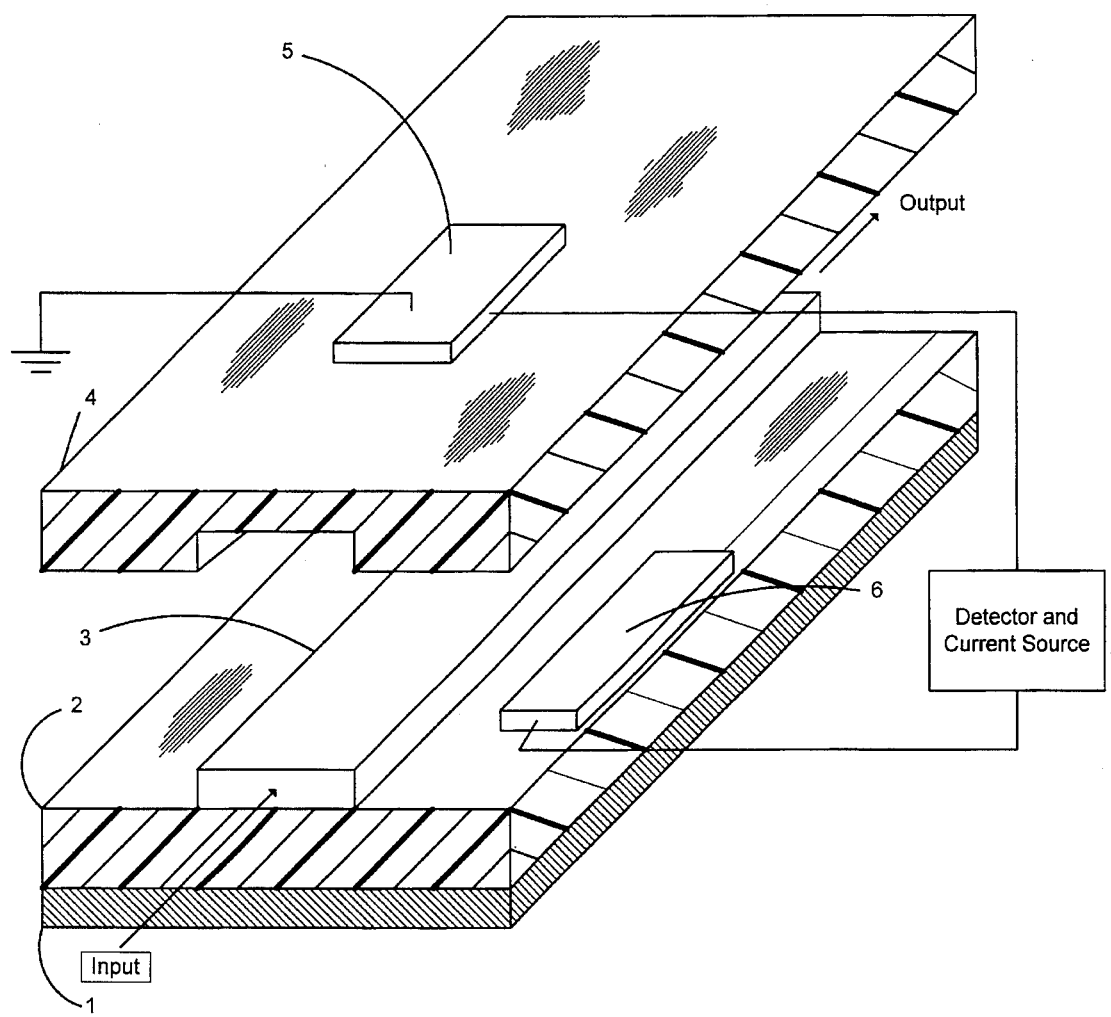
FIG. 1 is an exploded perspective view of one embodiment of the invention.
Figure 2:
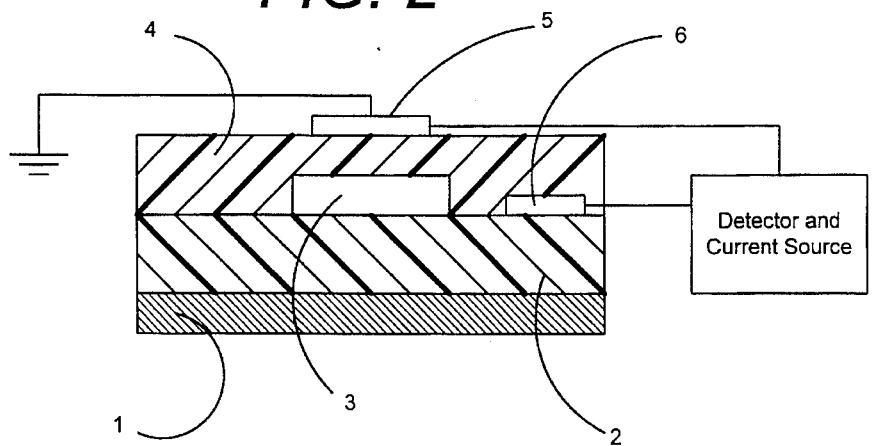
FIG. 2 is a cross-sectional view of the embodiment shown in FIG. 1.

Now referring to FIGS. 1 and 2, there is shown one preferred embodiment of the present invention in a microstrip configuration. As shown, the device is a five layer structure with a conductive ground plane 1, a dielectric substrate 2, a superconducting transmission line 3, with an input and an output a second dielectric substrate 4, and a heating element 5 which is placed on top of the second dielectric substrate directly over the microstrip line. The signal is fed into the input of the limiter as shown in FIG. 1. A loosely coupled coupler 6 samples and directs RF energy into a circuit that detects the energy level and drives a variable current through the heating element 5. When the input signal reaches a predetermined level this circuitry drives sufficient current through the heating element 5 to locally heat the superconducting microstrip line 3 to put it in a nonsuperconducting state or resistive state. The resistance will attenuate the signal and thus limit the incoming RF signal. By varying the control current, one can control the resistance of the superconducting line. Because the "on" and "off" states are dependent upon the superconducting properties of the microstrip line, the limiter will have practically zero "on" resistance. Further, the limiter will have very low losses because 1) the microstrip line is superconducting, 2) a low loss dielectric substrate can be selected and 3) the coupler only couples a minimum amount of signal energy.

Figure 3:
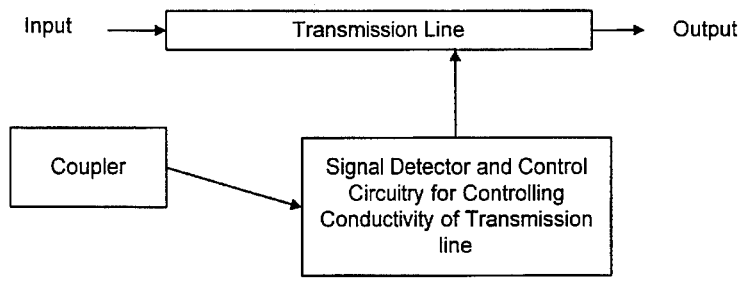
FIG. 3 is a generalized block diagram of the present invention.

A general configuration of the present invention is shown in FIG. 3. It includes a transmission line, with an input and an output, a coupler, and a control circuit to control the conductivity of the transmission line or the resistance of a variable resistor. When the RF signal reaches a predetermined level, the control circuit decreases the conductivity of the transmission line or increases the resistance of a variable resistor, and therefore limits the RF energy, which flows through the limiter. An example of a control circuit, which would be connected to the coupler in series to the element controlling the resistivity or conductivity of the transmission line, would include a diode connected to a ground and to a transistor. Of course, those skilled in the art could devise other circuits to control the conductivity/resistivity of the transmission line.

Figure 4:
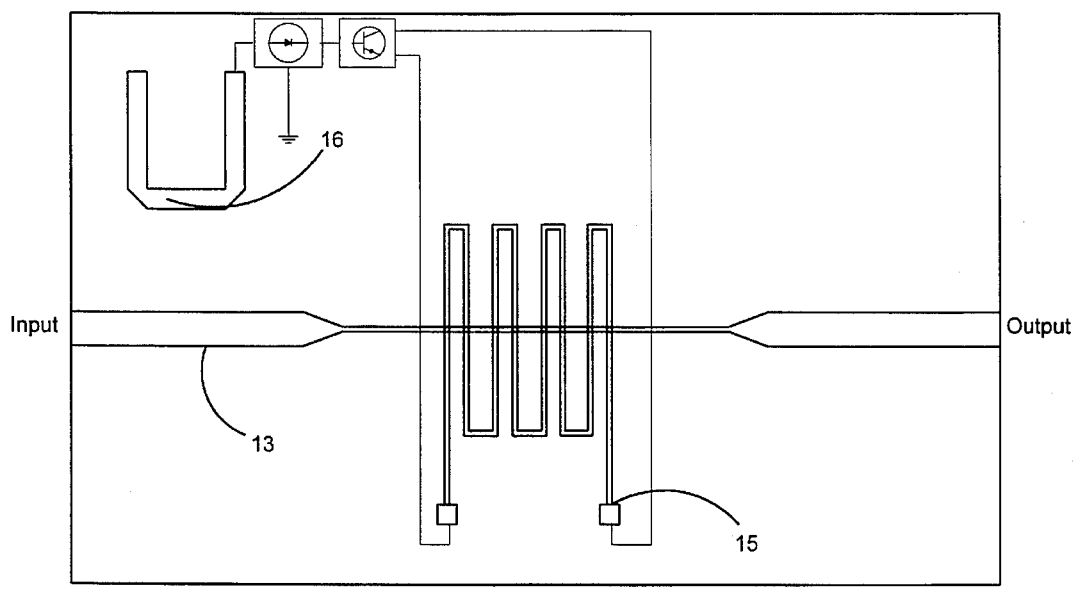
FIG. 4 is a top view of a second embodiment of the present invention.
Figure 5:
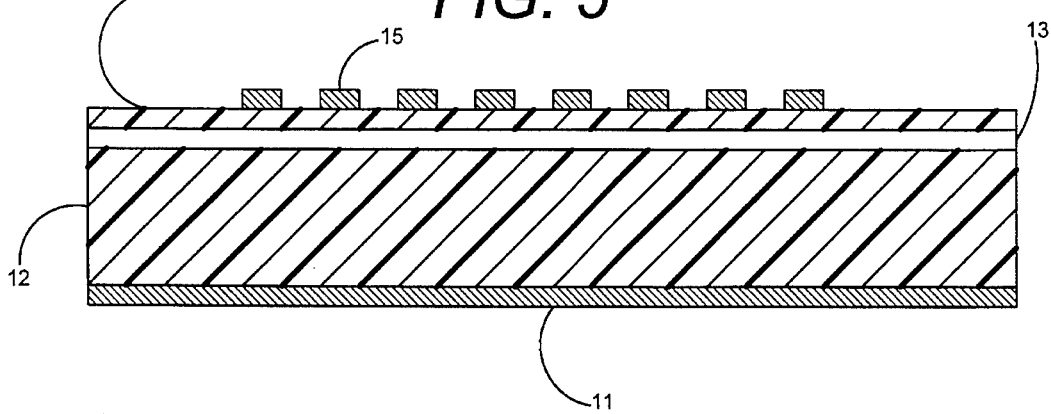
FIG. 5 is a cross-sectional view of the embodiment shown in FIG. 4.

Now referring to FIGS. 4 and 5, there is shown a second embodiment of the present invention. FIG. 4 is a diagram of the superconducting power limiter in a top view of the full device showing the superconducting transmission line 13 with an input and an output and with a heating element 15, in the form of a mendering heater line, above one section of the transmission line 13 and is preferably made from a thin film of $YBa_2Cu_3O_{7-x}$, a high-$T_c$ superconductor with a transition temperature near 90° K., and the heating element 15 is a thin layer of gold. There is also a superconducting coupler 16 near the input of the limiter. This coupler is used to sample the input RF signal power and drive a feedback circuit (shown as a diode connected to a transistor which, in turn, is connected, as shown, to the meander line) that, in turn, provides current to the heating element 15 if the input power exceeds a critical value.

FIG. 5 shows that the power limiter, in its preferred embodiment, uses a five layer microstrip geometry. This five layer structure includes a normal metal ground plane 11, a dielectric substrate 12, a superconducting transmission line 13, a dielectric film layer 14 and a heat generating element 15. The dielectric substrate 12 must be of low loss and a proper substrate for growth of the superconducting film in order to allow fabrication of a low loss device. In a preferred embodiment of the present invention, the device employs single crystal $LaAlO_3$ as the substrate 12. The thin dielectric layer 14 between the transmission line 13 and the heater 15 is necessary in order to prevent electrical connection between the microstrip conductor and the heater. In a preferred embodiment, this thin dielectric layer 14 is MgO.

In order to maximize the isolation in the "limiting" state while minimizing the insertion loss in the "non-limiting" state, the transmission line is preferred to be as narrow as possible, i.e. maximize its resistance when in the limiting state. A wet etch lithography may be used to pattern the transmission line because the minimum feature size that is reproducible with wet etch lithography is approximately 10 µm. Although for purposes of this invention a transmission line width of 25 µm would be sufficient to function.

In the "non-limiting" state, the high-$T_c$ line is superconducting and, therefore, will have essentially zero resistive losses. However, the reflective losses resulting from impedance mismatches must be minimized. For most common systems, this would mean that the input and output lines would impedance matched to 50 ohms. For example, if 0.25 mm thick substrate of $LaAlO_3$ is used, a 75 µm wide transmission line would be required to match the impedance to a 50 ohm system.

An example of a transition between input/output and the heated portion of the $HT_cS$ line would be a 25 µm $HT_cS$ line directly connected to the 75 µm wide transmission lines for the input and output sections. However, this type of transmission can lead to unwanted reflections. To eliminate this impedance discontinuity caused by this change in width, the transmission line should be made a multiple of a half wavelength. With the configuration shown in FIG. 4, zero reflections will occur from a change in characteristic impedance at any frequency in which the transmission line is a multiple of a half of a wavelength. If it is not made a multiple of a half wavelength, then the reflections are still very minimal. The RF line can be tapered from 75 µm to 25 µm to further reduce any reflections caused by the change in width, also as shown in FIG. 4.

Figure 6:
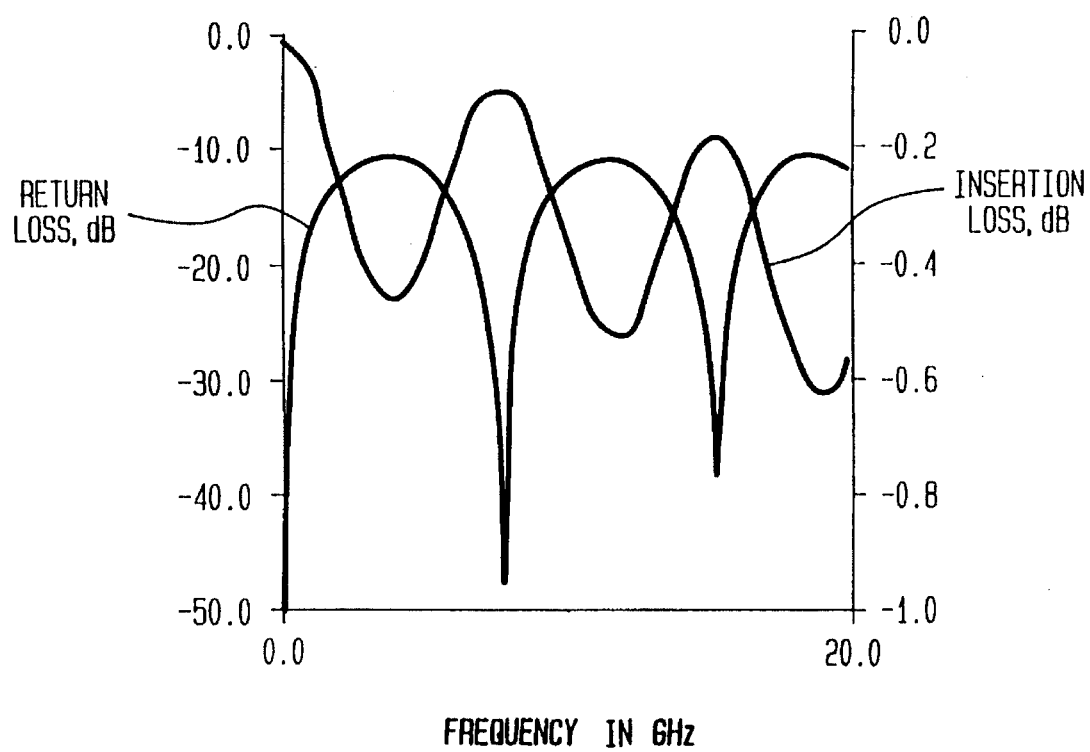
FIG. 6 is a graph of the invention's return and insertion loss as compared to frequency.

FIG. 6 shows the present invention's return and insertion losses compared to signal frequency. Note that the signal's periodicity is caused by the half wavelength effect mentioned above. With this effect removed/alleviated the graph of the return and insertion losses would provide a flat response.

The directional coupler should be designed to couple approximately 1% (≈0.04 dB of insertion loss) of the power from the main transmission line and to introduce zero reflections. The coupled power from the coupler to the detection circuitry will be detected by the diode mentioned previously. When the detected signal reaches a certain level, the current will be driven through the meander line heating element.

The multilayered structure shown in FIG. 5 is fabricated in several different steps. The initial step is fabricating a superconducting film of $YBa_2Cu_3O_{7-x}$ on the dielectric substrate of $LaAlO_3$ by a pulsed laser deposition process. Such a process is described by D. B. Chrisey et al., MRS Bulletin, Vol. 27, no. 2, 37 (1992) which is incorporated herein by reference. For this deposition, the substrate is heated to approximately 750° C. in an oxygen atmosphere of 150 mTorr. The substrate is positioned 7 cm from a ceramic target of the $YBa_2Cu_3$. A 248 nm light source formed from a pulsed KrF excimer laser is focused onto the target for an energy density of about $1.5J/cm^2$. The laser pulses induce a plasma or plume of the ceramic material, some of which is transported onto the nearby $LaAlO_3$ substrate to form the superconducting film. Once the deposition is complete, the sample is cooled in ½ atm of oxygen to reach the proper oxygen stoichiometry in the film.

The next step in the fabrication process is defining the transmission line and coupler. The pattern is defined by the wet etch photolithography, mentioned above, and the etch is accomplished using a saturated aqueous solution of ethylenediaminetetraacetic acid, commonly referred to as EDTA. Once the $HT_cS$ circuit has been defined, the MgO dielectric layer is deposited over that part of the transmission line to be covered by the meandering heater line. This may be accomplished by depositing the MgO by pulsed laser deposition in a fashion similar to that for the superconductor, except that the MgO may be deposited at room temperature resulting in an amorphous layer of the MgO.

Photolithography is used again to define the heater pattern and to define gold contact pads on the transmission line and coupler line. Gold is used for the heating element so that the contact and the heater metallization can be accomplished in one deposition. Of course, more resistive materials may be used for the heater, such as titanium. The final step is to metallize the ground plane with gold.

From this general description, those skilled in the art can form other transmission line configurations such as coplanar waveguides, suspended substrate, stripline, etc. Further, the present invention has been described using a heating element to control resistance of the $HT_cS$ transmission line, but the heating element and the $HT_cS$ transmission line can be replaced by any controllable variable resistor that has a very high conductance in the "non limiting" state. Furthermore, the limiter can be built with the controlled variable resistance connected in a shunt configuration. Additionally, those skilled in the art will recognize that the configuration of the meandering heating line may vary considerably in both length, width, composition and the number of meanders. For example, if a highly resistive material is used, such as titanium, then less electrical coupling will occur and accordingly, the meander line could be fabricated to be very short in length or simply be fabricated entirely over the transmission line.

Accordingly and although the present invention has been described with respect to two embodiments, those skilled in the art would be readily able to fabricate any number of devices given this disclosure. Therefore, this invention should be limited by the above description, but only by the following claims.

What is claimed is:

1. A power limiter comprising:
    a transmission line having an input and an output;
    an energy coupling means electrically connected to the transmission line and disposed adjacent to the input of the transmission line, the energy coupling means including drive circuitry for detecting coupled energy from the coupling means; and
    variable resistance means which is electrically connected to the energy coupling means in a feedback circuit via the drive circuitry, wherein the variable resistance means is driven to a different resistive state depending on a power of an input signal coupled by the coupling means, wherein the different resistive state of the variable resistance means electrically limits the power of the input signal through the transmission line.

2. A power limiter comprising:
    a transmission line having an input and an output;
    an energy coupling means electrically coupled to the transmission line and disposed adjacent to the input of the transmission line, the energy coupling means including drive circuitry for detecting coupled energy from the coupling means, wherein the drive circuitry of the coupling means includes a microstrip coupler connected to a diode, the diode being serially coupled from the microstrip coupler to a transistor; and
    variable resistance means which is electrically coupled to the energy coupling means in a feedback circuit via the transistor, wherein the variable resistance means is driven to a different resistive state depending on a power of an input signal coupled from the coupling means, and wherein the different resistive state of the variable resistance means electrically limits the power of the input signal through the transmission line.

3. The power limiter of claim 2 wherein the variable resistance means is a variable resistor.

4. The power limiter of claim 2 wherein the transmission line is superconducting microstrip line.

5. The power limiter of claim 4 wherein the variable resistor means is a heating element disposed over the superconducting microstrip line.

6. A power limiter comprising
    a ground plane;
    a first dielectric substrate disposed on the ground plane;
    a superconducting transmission line disposed on the first dielectric substrate;
    a second dielectric substrate disposed on the superconducting transmission line; and
    a selective heating means disposed on the second dielectric substrate, the selective heating means being able to heat the superconducting transmission line so as to selectively cause the superconducting transmission line to become nonsuperconducting when a determined critical power input is input into the power limiter.

7. The power limiter of claim 6 wherein a resistance of the superconducting transmission line is maximized at a predetermined portion of the microstrip.

8. The power limiter of claim 7 wherein the maximized resistance portion of the superconducting transmission line is a portion that is tapered.

9. The power limiter of claim 7 wherein the selective heating means is a resistive film disposed above the superconducting transmission line.

10. The power limiter of claim 9 wherein the resistive film is selected from the group consisting of gold, titanium, and aluminum.

11. The power limiter of claim 9 wherein the resistive film has a the shape of a meander line crossing the superconducting transmission line several times.

12. The power limiter of claim 6 wherein the selective heating means includes a coupling means disposed adjacent to an input of the superconducting transmission line.

13. The power limiter of claim 12 wherein the coupling means is a microstrip coupler adjacent the superconducting transmission line.

14. The power limiter of claim 13 further comprising drive circuitry coupled to the microstrip coupler, wherein the drive circuitry includes a diode connected to a transistor, the diode being serially coupled from the microstrip coupler to the transistor which is in turn coupled to the selective heating means.

15. The power limiter of claim 6 wherein the second dielectric substrate is MgO.

16. The power limiter of claim 6 wherein the superconducting transmission line is a microstrip line of $YBa_2Cu_3O_{7-x}$.

17. The power limiter of claim 6 wherein the first dielectric substrate is single crystal $LaAlO_3$.

* * * * *